US008575000B2

(12) United States Patent
Purayath et al.

(10) Patent No.: US 8,575,000 B2
(45) Date of Patent: Nov. 5, 2013

(54) COPPER INTERCONNECTS SEPARATED BY AIR GAPS AND METHOD OF MAKING THEREOF (75) Inventors: Vinod R. Purayath, Santa Clara, CA (US); James K. Kai, Santa Clara, CA (US); Jayavel Pachamuthu, Mie Pref (JP); Jarrett Jun Liang, San Francisco, CA (US); George Matamis, Danville, CA (US)

(73) Assignee: SanDisk Technologies, Inc., Plano, TX (US)

( * ) Notice: Subject to any disclaimer, the term of this patent is extended or adjusted under 35 U.S.C. 154(b) by 226 days.

(21) Appl. No.: 13/186,094

(22) Filed: Jul. 19, 2011

(65) Prior Publication Data
US 2013/0020708 A1   Jan. 24, 2013

(51) Int. Cl.
*H01L 21/76* (2006.01)
(52) U.S. Cl.
USPC .... 438/421; 438/656; 257/761; 257/E21.013; 257/E23.01; 257/E21.159
(58) Field of Classification Search
USPC .................. 438/421, 656; 257/761, E21.013, 257/E23.01, E21.159, E21.573, E21.581
See application file for complete search history.

(56) References Cited

U.S. PATENT DOCUMENTS

| | | | | |
|---|---|---|---|---|
| 5,001,079 A * | 3/1991 | van Laarhoven et al. | ..... | 438/666 |
| 5,310,700 A * | 5/1994 | Lien et al. | ..... | 438/618 |
| 5,372,969 A | 12/1994 | Moslehi | | |
| 5,545,919 A * | 8/1996 | Ueda et al. | ..... | 257/641 |
| 5,641,712 A * | 6/1997 | Grivna et al. | ..... | 438/624 |
| 5,691,573 A * | 11/1997 | Avanzino et al. | ..... | 257/758 |
| 5,716,888 A * | 2/1998 | Lur et al. | ..... | 438/619 |
| 5,776,834 A * | 7/1998 | Avanzino et al. | ..... | 438/692 |
| 5,837,618 A * | 11/1998 | Avanzino et al. | ..... | 438/778 |
| 6,083,821 A * | 7/2000 | Reinberg | ..... | 438/619 |
| 6,093,633 A * | 7/2000 | Matsumoto | ..... | 438/622 |
| 6,136,687 A * | 10/2000 | Lee et al. | ..... | 438/624 |
| 6,159,845 A * | 12/2000 | Yew et al. | ..... | 438/637 |
| 6,162,723 A * | 12/2000 | Tanaka | ..... | 438/638 |
| 6,204,200 B1 * | 3/2001 | Shieh et al. | ..... | 438/778 |
| 6,281,585 B1 * | 8/2001 | Bothra | ..... | 257/758 |
| 6,291,030 B1 * | 9/2001 | Chao et al. | ..... | 427/579 |
| 6,297,554 B1 * | 10/2001 | Lin | ..... | 257/752 |
| 6,303,464 B1 * | 10/2001 | Gaw et al. | ..... | 438/422 |
| 6,306,761 B1 * | 10/2001 | Taguchi | ..... | 438/646 |
| 6,387,797 B1 * | 5/2002 | Bothra et al. | ..... | 438/619 |
| 6,406,992 B1 * | 6/2002 | Mao et al. | ..... | 438/622 |

(Continued)

OTHER PUBLICATIONS

Noguchi, J., et al., "Reliability of Air-Gap Cu Interconnect and Approach to Selective W Sealing Using 90nm Node Technology", IITC 2004, Jun. 2004, pp. 81-83, IEEE.

(Continued)

*Primary Examiner* — Jarrett Stark
*Assistant Examiner* — Caleb Henry
(74) *Attorney, Agent, or Firm* — The Marbury Law Group PLLC (57) ABSTRACT

A semiconductor device including a plurality of copper interconnects. At least a first portion of the plurality of copper interconnects has a meniscus in a top surface. The semiconductor device also includes a plurality of air gaps, wherein each air gap of the plurality of air gaps is located between an adjacent pair of at least the first portion of the plurality of bit lines.

3 Claims, 5 Drawing Sheets

(56) References Cited

U.S. PATENT DOCUMENTS

| | | | |
|---|---|---|---|
| 6,426,267 B2 * | 7/2002 | Liou | 438/319 |
| 6,627,549 B2 * | 9/2003 | Juengling | 438/689 |
| 6,881,668 B2 * | 4/2005 | Lee et al. | 438/652 |
| 7,042,095 B2 * | 5/2006 | Noguchi et al. | 257/762 |
| 7,045,849 B2 * | 5/2006 | Chen et al. | 257/314 |
| 7,091,611 B2 | 8/2006 | Ahn et al. | |
| 7,125,800 B2 * | 10/2006 | Juengling | 438/689 |
| 7,235,865 B2 * | 6/2007 | Juengling | 257/635 |
| 7,501,347 B2 * | 3/2009 | Noguchi et al. | 438/700 |
| 7,569,465 B2 * | 8/2009 | Chen et al. | 438/588 |
| 7,579,233 B2 * | 8/2009 | Hwang | 438/239 |
| 7,602,038 B2 * | 10/2009 | Zhu | 257/522 |
| 7,687,911 B2 * | 3/2010 | Dominguez et al. | 257/758 |
| 7,704,851 B2 * | 4/2010 | Kim | 438/422 |
| 7,807,563 B2 * | 10/2010 | Gabric et al. | 438/619 |
| 7,855,139 B2 * | 12/2010 | Smith | 438/619 |
| 8,022,455 B2 * | 9/2011 | Hwang | 257/296 |
| 8,058,138 B2 * | 11/2011 | McGinnis et al. | 438/422 |
| 8,247,902 B2 * | 8/2012 | Noguchi et al. | 257/758 |
| 8,293,617 B2 * | 10/2012 | McGinnis et al. | 438/422 |
| 8,362,542 B2 * | 1/2013 | Kang et al. | 257/315 |
| 2001/0051423 A1 * | 12/2001 | Kim et al. | 438/624 |
| 2001/0053612 A1 * | 12/2001 | Juengling | 438/760 |
| 2002/0014697 A1 * | 2/2002 | Tamaoka et al. | 257/758 |
| 2003/0077893 A1 * | 4/2003 | Demolliens et al. | 438/622 |
| 2003/0129832 A1 | 7/2003 | Fujikawa | |
| 2003/0183940 A1 * | 10/2003 | Noguchi et al. | 257/767 |
| 2004/0232496 A1 * | 11/2004 | Chen et al. | 257/390 |
| 2005/0186796 A1 * | 8/2005 | Lin et al. | 438/688 |
| 2006/0183317 A1 | 8/2006 | Noguchi | |
| 2006/0231884 A1 * | 10/2006 | Yonemochi et al. | 257/314 |
| 2007/0045769 A1 * | 3/2007 | Bian et al. | 257/510 |
| 2007/0090531 A1 * | 4/2007 | Offenberg et al. | 257/758 |
| 2007/0128853 A1 * | 6/2007 | Lee | 438/637 |
| 2007/0182013 A1 * | 8/2007 | Zhu | 257/751 |
| 2007/0264819 A1 * | 11/2007 | Offenberg et al. | 438/623 |
| 2008/0057666 A1 * | 3/2008 | Kim | 438/422 |
| 2008/0108219 A1 | 5/2008 | Huebinger et al. | |
| 2009/0023279 A1 * | 1/2009 | Kim et al. | 438/594 |
| 2009/0298282 A1 * | 12/2009 | Yun et al. | 438/653 |
| 2010/0130001 A1 * | 5/2010 | Noguchi | 438/627 |
| 2011/0140275 A1 * | 6/2011 | Noguchi et al. | 257/751 |

OTHER PUBLICATIONS

Harada, T., et al., "Extremely Low Keff (1.9) Cu Interconnects with Air Gap Formed Using SiOC", IITC 2007, Jun. 2007, pp. 141-143, IEEE.

Uno, S., et al., "Sacrificial CVD Film Etch-Back Process for Air-Gap Cu Interconnects", Thin Solid Films, vol. 515, Issue 12, Apr. 2007, pp. 4960-4965.

International Search Report and Written Opinion issued in International Application No. PCT/US2012/046490, dated Jan. 16, 2013.

Invitation to Pay Additional Search Fee issued in corresponding Application No. PCT/US2012/046490, dated Oct. 22, 2012.

* cited by examiner

COPPER INTERCONNECTS SEPARATED BY AIR GAPS AND METHOD OF MAKING THEREOF

FIELD

The present invention is directed to semiconductor devices and more specifically to interconnects for semiconductor devices and methods of making thereof.

BACKGROUND

Every successive generation of integrated circuits brings smaller devices to increase device density and speed. However, as integrated circuit devices get smaller, the signal delay due to resistive-capacitive (RC) effects becomes more pronounced. This delay can be reduced by decreasing either the resistance of the wiring, or by reducing the capacitance of the interlayer insulating layer. To reduce resistance, aluminum wiring has been replaced with copper in many conventional devices. However, it has been difficult to reduce the capacitance of the interlayer insulating layer used with copper interconnects.

SUMMARY

An embodiment relates to a semiconductor device including a plurality of copper interconnects. At least a first portion of the plurality of copper interconnects has a meniscus in a top surface. The semiconductor device also includes a plurality of air gaps, wherein each air gap of the plurality of air gaps is located between an adjacent pair of at least the first portion of the plurality of bit lines.

Another embodiment relates to a method of making a semiconductor device. The method includes providing a substrate comprising a plurality of sacrificial rails separated by trenches and sputtering a non-conformal copper layer at a temperature above 150° C. in the trenches and over the sacrificial rails. The method also includes heating the semiconductor device to a temperature above 300° C. to reflow the copper layer from the top of the sacrificial rails into the trenches to form copper rails in the trenches and removing at least a portion of the sacrificial rails after reflowing the copper layer. The method further includes depositing a non-conformal insulating layer over the copper rails such that air gaps are formed between adjacent copper rails.

Another embodiment, relates to a method of making a semiconductor device. The method includes providing a substrate comprising a plurality of trenches in a sacrificial material and depositing a conductive layer in the trenches such that the conductive layer partially fills the plurality of trenches. The method also includes forming a cap over the conductive layer in the trenches and removing the sacrificial material to leave a plurality of capped conductive interconnects. The method further includes depositing a non-conformal insulating layer over the plurality of capped conductive interconnects such that air gaps are formed between adjacent conductive interconnects.

DETAILED DESCRIPTION

The present inventors have developed a process by which air gaps can be formed between the copper interconnects, such as copper bit lines of a semiconductor device. In this manner, the conventional interlayer insulating layer, $SiO_2$, which has a dielectric constant of approximately 4 can be replaced with an air gap, which has a dielectric constant of approximately 1. In one embodiment, a substrate is provided in which a surface of the substrate includes a plurality of sacrificial rails separated by trenches. A non-conformal layer of copper is then deposited on the sacrificial rails and in the trenches. The substrate is then heated to a temperature at which copper reflows, for example 300 C. Under gravitational and capillary forces, the copper deposited on the tops of the rails reflows into the trenches. In an embodiment, the combined copper initially deposited in the trenches plus the reflowed copper does not completely fill the trenches. In this condition, the upper surface of the copper forms a meniscus due to the surface tension in the copper. To protect the upper surface of the copper from oxidation, a barrier cap layer is then deposited in the trench on top of the copper. As-deposited, the barrier cap layer also covers the sacrificial rails.

A planarization step, such as a chemical-mechanical polish (CMP) may then be performed to remove the barrier cap layer from the tops of the sacrificial rails while leaving a protective barrier over the copper in the trenches. A selective etch may then be performed to remove the sacrificial rails. The selective etch results in a plurality of oxidation barrier coated copper rails separated by trenches. An insulating material may then be deposited on top of the coated copper rails using a non-conformal deposition process. The use of a non-conformal deposition process results in a continuous layer of insulating material across the tops of the coated copper rails with little or no insulating material filling the trenches to leave air gaps in the trenches. In this manner, copper bit lines separated by air gaps are formed.

Air gap separated interconnects may be used in a wide number of different semiconductor devices. For example, air gap separated copper interconnects may be used in nonvolatile memory devices, such as NAND memory devices. For example, the interconnects may comprises NAND copper bit lines in a NAND memory cell region of a NAND memory device or copper interconnects for the NAND peripheral region of the NAND memory device as will be discussed in more detail below.

Figure 1:
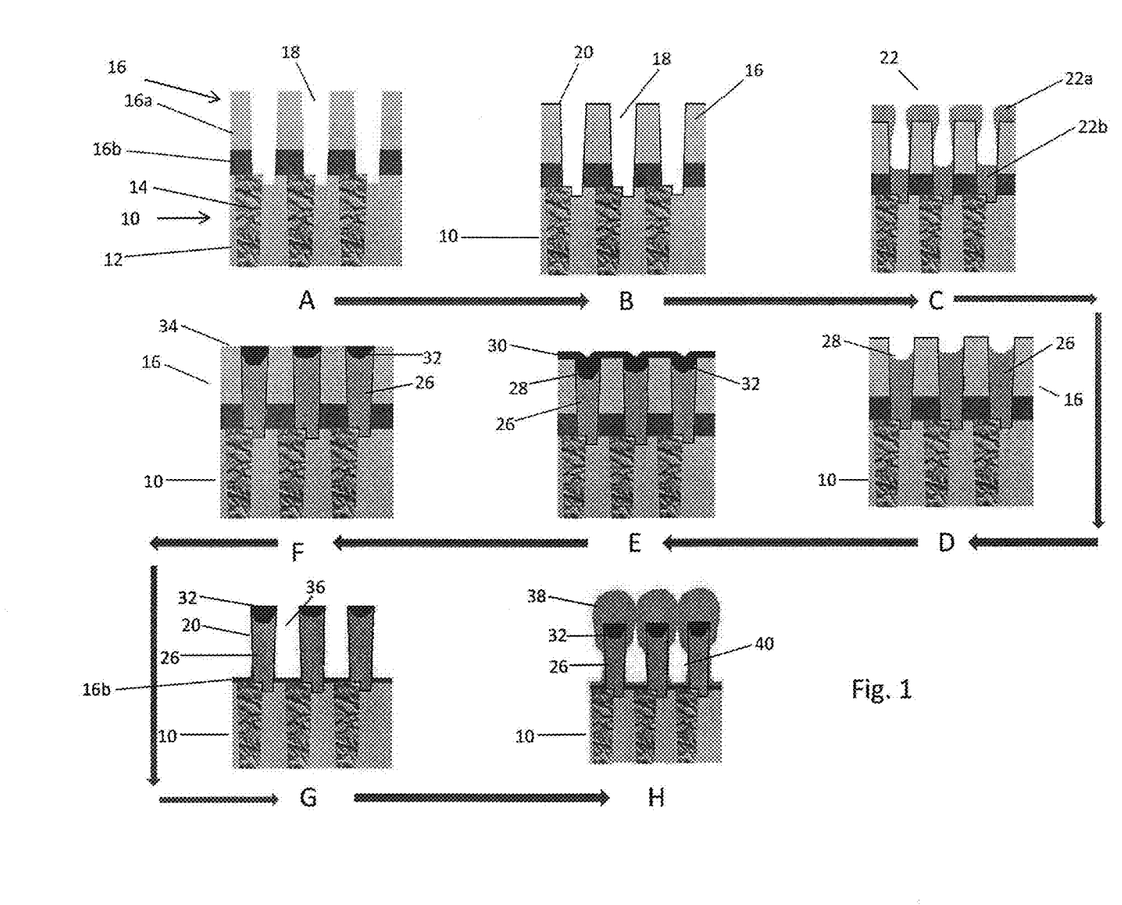
FIGS. 1A-1H illustrate schematic side cross sectional views of steps in a method of making a semiconductor device having air gaps between copper interconnects.

FIGS. 1A-1H illustrate an embodiment of a method of making a semiconductor device having air gaps between interconnects, such as copper interconnects. In FIG. 1A, a substrate 10 is provided with alternating insulating portions 12 and conducting portions 14. The insulating portions 12 may comprise any suitable interlayer insulating layer material, such as silicon oxide. The conducting portions 14 may comprise conductive plugs that are used to transport electrical current between the interconnects and semiconductor devices located below the plugs (e.g., NAND memory devices comprising a semiconductor channel in a silicon substrate or in a silicon layer over a substrate, source and drain regions adjacent to the channel, floating gate electrodes separated from the channel by a gate insulating layer and control gate electrodes located over the floating gate electrodes). The plugs 14 and may be made of any suitable conducting material, such as tungsten. Sacrificial rails 16 are provided on the substrate 10. In an embodiment, the sacrificial rails 16 comprise two portions made of different materials. The upper portions 16a of the sacrificial rails 16 comprise a material that is selectively etchable with respect to the lower etch stop portions 16b. The lower etch step portions 16b of the sacrificial rails 16 comprise a material that is more etch resistant to the etching gas or liquid used to etch the upper portions 16a. When the upper portions 16a of the sacrificial rails 16 comprise silicon oxide (e.g., $SiO_2$ or non-stoichiometric versions thereof), the lower portions 16b may comprise silicon nitride (e.g., $Si_3N_4$ or non-stoichiometric versions thereof), such as silicon nitride formed by atomic layer deposition or by hexachlorodisilane (HCD) precursor CVD. Any other suitable materials with different etch characteristics may be used instead. The space between each pair of sacrificial rails 16 defines a trench 18 which extends in and out of the page in FIG. 1A.

As illustrated in FIG. 1A, the sacrificial rails 16 may optionally be tapered such that the base (proximal to the substrate) of the rails is wider than the top (distal to the substrate) of the rails. This results in trenches 18 that are narrower proximal to the substrate and wider distal from the substrate. In an embodiment, the width of the base of the trench 18 may be 10-20 nm, such as 15-20 nm while the width of the top of the trenches 18 may be 20-30 nm. In alternative embodiments, wider or narrower trenches 18 with lesser or greater variation in width from base to top may be fabricated by fabricating sacrificial with smaller or greater pitch and having lesser or greater slope.

As illustrated in FIG. 1B, a layer of etch resistant material (i.e., a material that is more etch resistant to the etching gas or liquid used to etch the upper portions 16a of rails 16) is conformally deposited on substrate 10. This deposition results in the formation of a conformal liner 20 which coats the tops and sides of the sacrificial rails 16 and the bottoms of the trenches 18. The conformal liner 20 may be made of any suitable oxidation resistant material, such as tantalum nitride (e.g., TaN or non-stoichiometric versions thereof). As will become apparent below, the conformal liner 20 is configured to protect the copper interconnect from oxidation and damage during fabrication.

In the step illustrated in FIG. 1C, a non-conformal copper layer 22 is deposited over the conformal liner 20. A first portion 22a of the copper layer 22 is deposited on top of the sacrificial rails 16 while a second portion 22b of the copper layer is deposited in the trenches 18. Deposition may be performed by any suitable method such as sputtering or chemical vapor deposition. Deposition may be performed at temperatures such as 150 or higher, such as 150-300 C., for example 175-250 C.

In the next step, illustrated in FIG. 1D, the substrate is heated to a suitable temperature to reflow the copper layer 22, such as a temperature greater than 300 C., such as 300-450 C., for example 350-400 C. The temperature may be lower than the melting temperature of copper. In this step, gravitational and capillary forces cause the first portion 22a of the copper layer 22 to reflow into the trenches 18 on top of the second portion 22b of the copper layer 22, forming copper rails 26 in the trenches 18. Preferably, the total amount of the first and second portions 22a, 22b of the copper layer 22 do not completely fill the trench 18. That is, the sacrificial rails 16 are higher than the copper rails 26. Due to the surface tension of the copper and interaction with the sidewalls of the sacrificial rails 16, the top surface of the copper rail 26 forms a meniscus 28. That is, the top surface of the copper rail forms a curved surface with high portions adjacent the sacrificial rails 16 and a minimum height approximately in the center of the copper rail 26.

In the step illustrated in FIG. 1E, a barrier cap layer 30 comprising an oxidation resistant material, such as tantalum nitride (e.g., TaN or non-stoichiometric versions thereof), is deposited on the surface of the liner 20 covered sacrificial rails 16 and the surface of the copper rails 26. Preferably, sufficient oxidation resistant material is deposited to essentially fill the remaining empty spaces in the trenches 18 over the copper rails 26. Because of the meniscus 28, the cap layer 30 forms a cap plug 32 on top of the copper rails 26.

A planarization step is the performed as illustrated in FIG. 1F. Planarization may be performed, for example, by chemical-mechanical polishing (CMP) or etch back. Preferably, planarization is performed until the top surface 34 of the sacrificial rails 16 are exposed and are essentially free of the oxidation resistant material. That is, planarization is performed until the cap layer 30 and the liner 20 are removed from the top surface 34 of the sacrificial rails 16. However, the top surfaces of the copper rails 26 are still covered by plug 32 of the oxidation resistant cap material because the rails 26 are recessed in the trenches 18.

In the next step illustrated in FIG. 1G, at least a portion of the sacrificial rails 16 are removed by selective etching. The selective etch removes the upper portions 16a of the sacrificial rail 16 and optionally a part of the lower etch stop portion 16b of the sacrificial rails 16. Preferably, a small thickness of the lower etch stop portion 16b of the sacrificial rail 16 is left to protect the surface of the substrate 10. For example, a Siconi dry etch or wet etch may be used to remove the silicon oxide upper portions 16a of the rails 16 while stopping on the lower etch stop portions 16b. Further, the conformal liner 20 is preferably made of a material (e.g., TaN) that is more etch resistant than the materials of the upper portions 16a and the lower portions 16b of the sacrificial rail 16. Thus, when the upper portions of the sacrificial rails 16 are removed, the liner 20 remains coated on the sidewalls of the copper rails 26. In this manner, the copper rails 26 are entirely protected from oxidation by the liner 20 and the cap plug 32 during the removal of silicon oxide portions 16a of the sacrificial rails 16. Thus, at least upper portions 16a of the sacrificial rails 16 are removed without significantly etching the cap plug 32, the liner 20 or the copper rails 26. The copper rails 26 are not oxidized or damaged because they are sealed by the cap layer/plug 30/32 on their top surface, the liner 20 on their sidewalls, and at least one of a conductive plug 14 and an interlayer insulating layer 12 on their bottom surface.

Removal of the sacrificial rails 16 between the copper rails 26 results in the formation of new trenches 36 between the liner 20 and cap plug 32 covered copper rails 26. The copper rails 26 comprise interconnects for a semiconductor device, such as bit lines for a NAND device. The interconnects 26 may be used for any other memory, logic or optoelectronic devices.

As shown in FIG. 1H, a non-conformal layer of insulating material 38 is deposited on top of the copper rails 26 without completely filling the trenches 36. The non-conformal insulating layer 38 is located in contact with the cap 32 and an upper portion of the liner 20 on the copper interconnects 26, while air gaps 40 remain between the copper rails/interconnects 26. The liner 20 separates each of at least the first plurality of copper interconnects 20 from two adjacent air gaps 40.

The layer of insulating material 38 may comprise, but is not limited to $SiO_2$. Preferably, the layer of insulating material 38 is deposited by a non-conformal deposition process to prevent complete filling of the trenches 36 between the copper rails 26. Non-conformal deposition processes, include, but are not limited to sputtering and chemical vapor deposition (CVD), such as plasma enhanced chemical vapor deposition (PECVD). For example, PECVD using a silane and at least one of nitrous oxide and ozone sources, or high density plasma (HDP) may be used to deposit a non-conformal silicon oxide layer. Any other suitable insulating material, such as silicon nitride, etc., may be used instead. In an embodiment, the layer of insulating material 38 is continuous. That is, the layer of insulating material 38 completely covers the air gaps 40.

Figure 2:
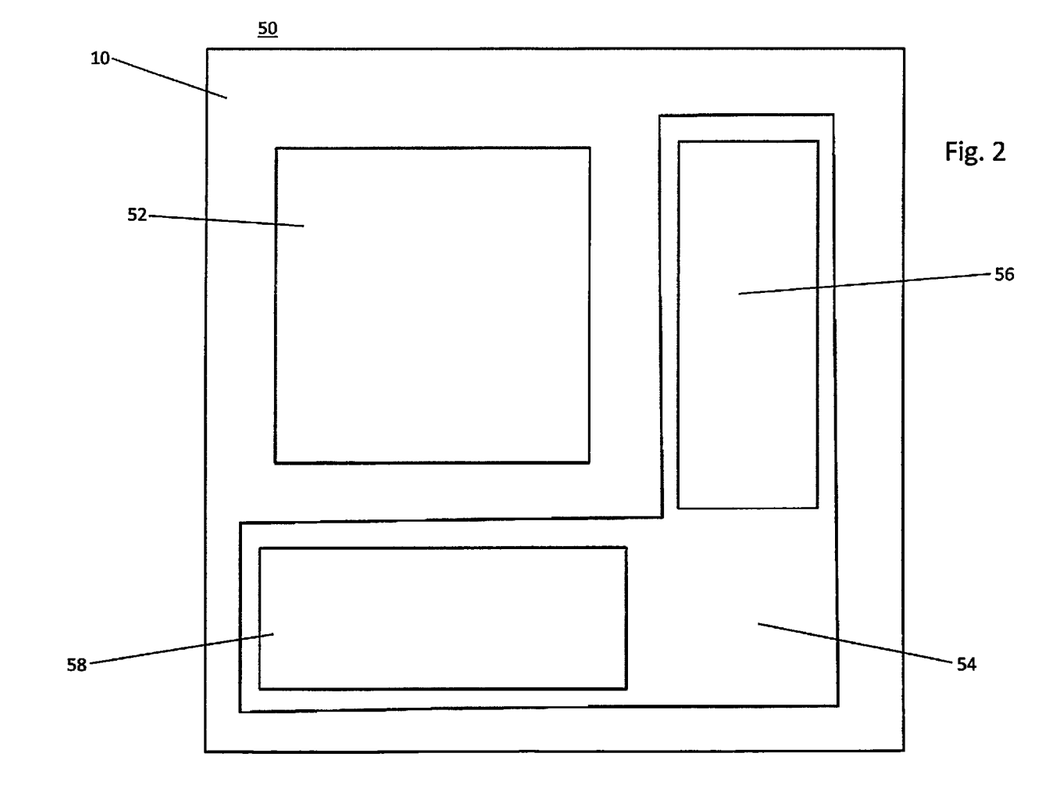
FIG. 2 is a schematic top view illustration of semiconductor device according to an embodiment.

FIG. 2 is a schematic illustration of a semiconductor device 50 according to another embodiment. The semiconductor device 50 may be, for example, a non-volatile memory, such as a NAND device, located in, on, under or over the above described substrate 10. The semiconductor device 50 includes a memory area 52, which may include an array of memory cells (e.g., each NAND cell containing a channel, source, drain, plural floating gates or charge storage dielectrics and corresponding control gates) and a peripheral area 54, which may include peripheral devices. Example peripheral devices include driver circuits, word line decoders 56 and bit line decoders 58. Other peripheral devices, such as clocks, may also be fabricated in the peripheral area 54.

The following embodiments illustrate interconnects (with and without air gaps) having a different shape fabricated in the memory area 52, the peripheral area 54, and in the area connecting the peripheral area 54 with the memory area 52.

FIGS. 3A-3D illustrate schematic side cross sectional views of steps in a method of making copper interconnects using plating in a peripheral area of a memory device according to an embodiment. Preferably, these peripheral copper interconnects are deposited by copper seed formation and electrochemical plating of copper. These peripheral area copper interconnects have a flat top surface and lack the meniscus 38 in the top surface.

Figure 3A:
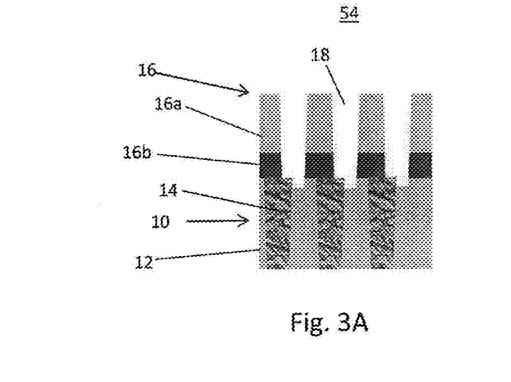
FIGS. 3A-3D illustrate schematic side cross sectional views of steps in a method of making copper interconnects using plating in a peripheral area of a memory device according to an embodiment.
Figure 3B:
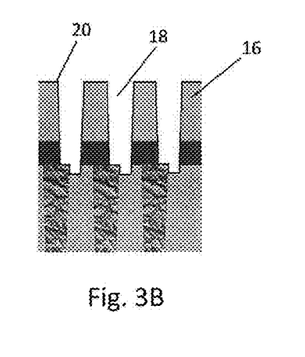

FIGS. 3A and 3B are identical to FIGS. 1A and 1B, except that they illustrate formation of the sacrificial rails 16 and liner 20 in the peripheral area 54 of the device. The rails 16 and liner 20 in the peripheral area 54 may be made at the same time as the rails 16 and liner 20 in the memory cell area 52 shown in FIGS. 1A and 1B.

Figure 3C:
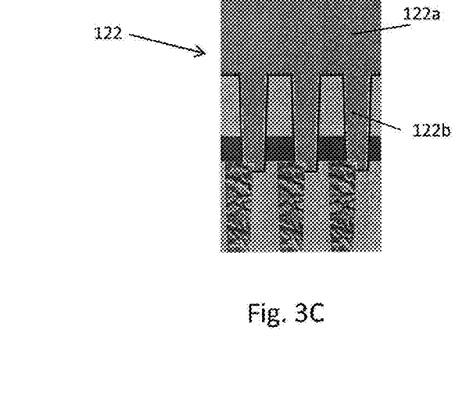
Figure 3D:
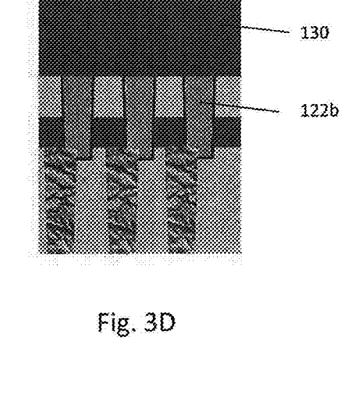

Thereafter, the memory cell area 52 is covered by a protecting mask, such as a silicon nitride mask, while the processing continuous in the peripheral area 54 as shown in FIGS. 3C and 3D. After the step shown in FIG. 3D is completed, the protecting mask in the memory cell area is removed and process steps shown in FIGS. 1C-1H continue in the memory cell area 52. If desired, the peripheral area may be covered by a second protecting mask, such as a silicon nitride mask, during the steps shown in FIGS. 1C-1H.

FIG. 3C illustrates formation of a plated copper layer 122 in the peripheral area 54. In this step, a conventional copper seed and electro-chemical plated (ECP) copper layer 122 is formed over the rails 16 and liner 20. The copper layer contains a first portion 122a over the rails 16 and a second portion 122b in the trenches 18 between the rails 16. However, since ECP requires application of current to the copper layer, the first portion 122a must be continuous over all rails 16 and trenches 18 in order to provide current from the ECP electrodes to all second portions 122b in the trenches 18. Thus, the ECP copper layer 122 in this ECP process cannot be deposited to only partially fill the trenches, in contrast to the sputtered copper layer 22 shown in FIG. 1C.

FIG. 3D shows the next step in the process where the ECP copper layer 122 is planarized (e.g., by CMP) with the top surface of the liner 20 covered rails 16 to leave only the second portions 122b of the copper layer in the trenches 18. The second portions 122b form copper interconnects which have a flat top surface (e.g., planarized by CMP) and lack the meniscus 38 in the top surface.

After the planarization, a cap layer 130, such as silicon nitride, is deposited quickly on the copper interconnects 122b in the trenches 18 to prevent copper oxidation or whisker formation. Thus, rail 16 removal to form air gaps in this process is not feasible. The rails 16 remain as the interlayer insulating layer between the copper interconnects 122b in this process.

Figure 4A:
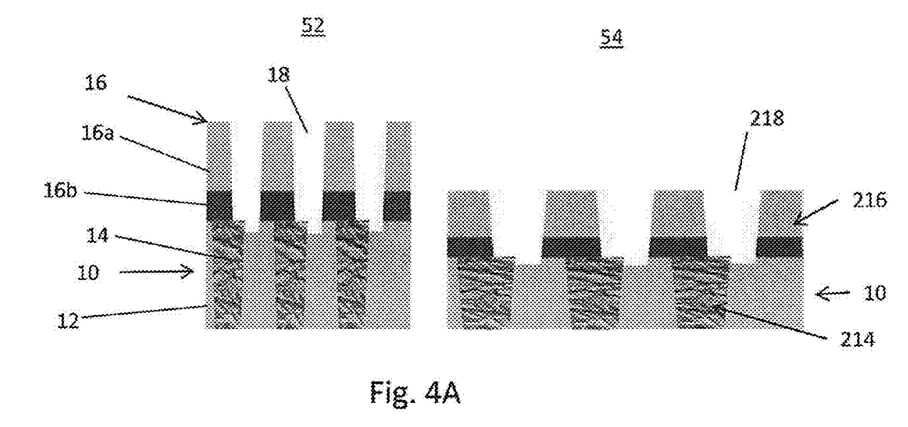
FIGS. 4A-C and 5A illustrate schematic side cross sectional views of steps in methods of making different shape copper interconnects in memory cell and peripheral areas of a memory device according to alternative embodiments.
Figure 4B:
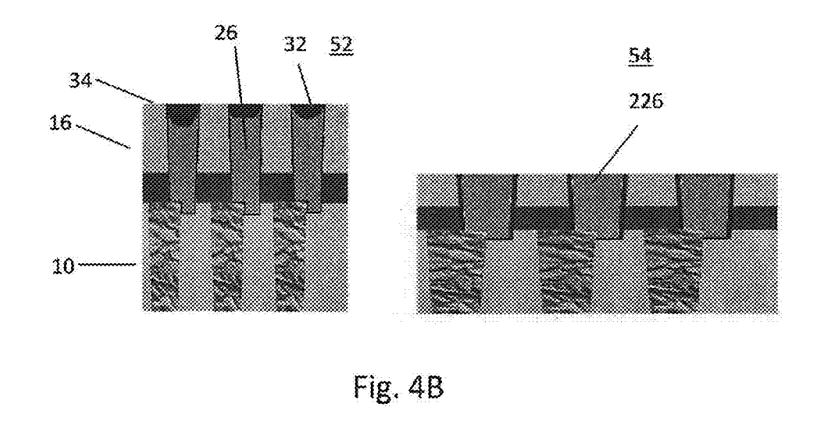
Figure 4C:
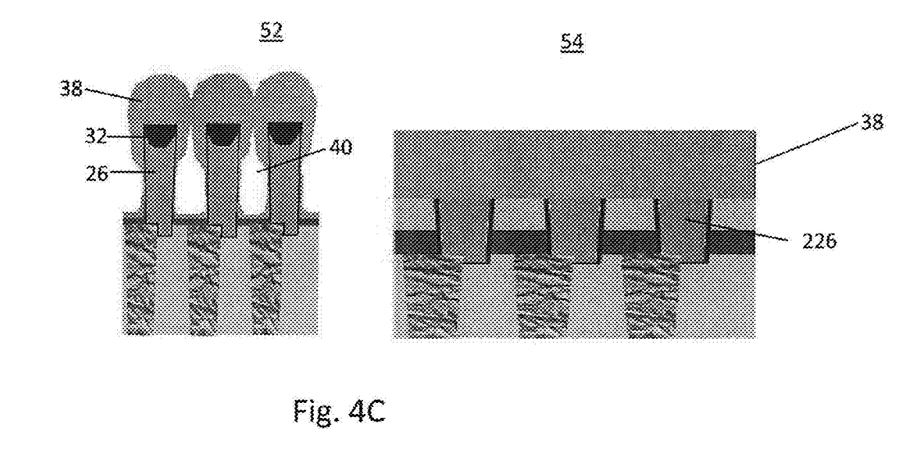

FIGS. 4A-4C illustrate method steps of an alternative embodiment of the invention. In this embodiment, the trenches 218 between rails 216 in the peripheral area 54 are wider and shallower than the trenches 18 between rails 16 in the memory cell area 52, as shown in FIG. 4A. In other words, rails 216 in area 54 are shorter and wider spaced apart from each other than rails 16 in area 52 on the same substrate 10. For example, if trenches 18 are 10-30 nm wide, then trenches 218 may be at least ten times wider, such as 300-400 nm wide. Furthermore, the conducting portions in the peripheral area 54, such as the tungsten plugs 214 exposed in trenches 218, may be wider than the respective tungsten plugs 14 exposed in trenches 18 in the memory cell area 52.

The copper interconnects 26, 226 are then deposited into the respective trenches 18, 218 during the same deposition step, as shown in FIG. 4B. The copper interconnects 26, 216 may be deposited by sputtering and reflow, as described above with respect to FIGS. 1B-1D. Thus, copper interconnects 226 in trenches 218 in area 54 are wider and thinner than copper interconnects 26 in trenches 18 in area 52. The interconnects 226 completely fill the shallower trenches 218 in area 54 while the interconnects 26 only partially fill the deeper trenches 18 in area 52.

As described above with respect to FIG. 1E, a barrier cap layer 30 is then deposited over both sets of interconnects 26, 226. The barrier cap layer 30 is then planarized (e.g., by CMP) as shown in FIGS. 1F and 4B. The cap plug 32 remains in a meniscus 28 on a top surface of the copper interconnects 26 in trenches 18 between the sacrificial rails 16 in area 52 because the interconnects 26 do not completely fill the trenches 18. However, the barrier cap layer 30 is removed completely by the planarization over the copper interconnects 226 which completely fills the shallower peripheral area 54 trenches 218. In other words, layer 30 does not extend into trenches 218 in area 54 and is thus completely removed in area 54 and copper interconnects 226 in area 54 lack a cap plug 32 on their top surface.

The air gaps 40 between adjacent interconnects 26 in the memory cell area 52 are then formed using the same etching and deposition steps described above with respect to FIGS. 1G-1H. If no air gaps are to be formed in the peripheral area, then a protecting mask is formed over the peripheral area 54 during the sacrificial rail 16 etching step to form trenches 36 shown in FIG. 1G. The protecting mask may then be removed if it is not desired to retain it in the completed device, and the non-conformal insulating layer 38 is formed over both the memory cell area 52 and the peripheral area 54 as shown in FIG. 4C. Layer 38 encloses the air gaps 40 in the memory cell area 52 and forms a continuous insulating layer over the peripheral area 54.

Figure 5A:
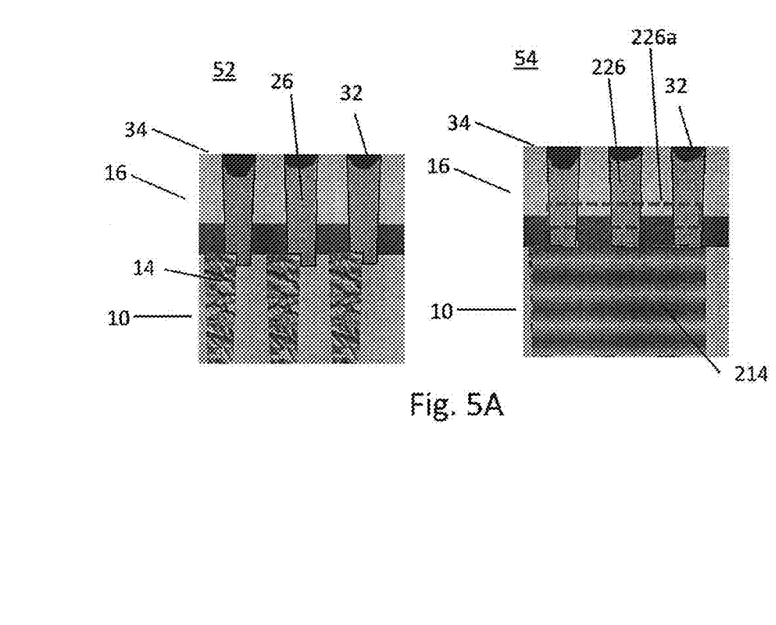
Figure 5B:
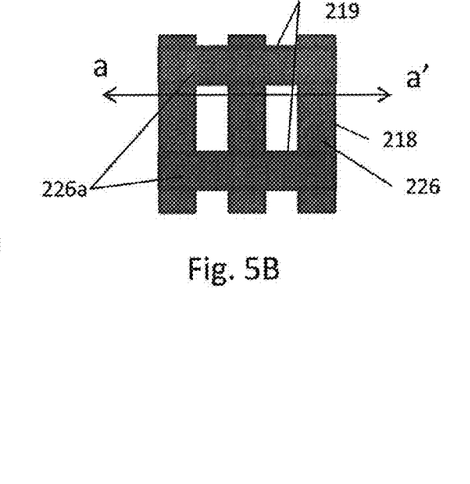
FIG. 5B is a top view of the right side of FIG. 5A, while the right side of FIG. 5A is a side cross sectional view along line a-a' in FIG. 5B.

In another alternative embodiment shown in FIGS. 5A-5B, the trenches 18 in the memory cell area 52 have the same width as the trenches 218 in the peripheral area 54. Thus, the trenches 18 and 218 may be formed in the same photolithography step. However, the tungsten plugs 14 in the memory cell area 52 are narrower than the tungsten plugs 214 in the peripheral area 54. Thus, each tungsten plug 214 in the peripheral area is exposed in plural trenches 218, such as in two to ten trenches for example. In contrast, each plug 14 in the memory cell area 52 is exposed in only one trench 18.

As shown in FIG. 5A, the copper interconnects 26 are formed in trenches 18 in area 52 and the copper interconnects 226 are formed in trenches 318 in area 54 during the same deposition step(s), such as the steps of sputtering the non-conformal copper layer and heating the semiconductor device to reflow the non-conformal copper layer, as described above with respect to FIGS. 1C-1D and 4A-4B. In this embodiment, depending on the relative depth of trenches 18 and 218, the copper interconnects 226 in the peripheral area 54 may have a meniscus 28 and a cap plug 32 just as the copper interconnects 26 in the memory cell area 52.

As shown in FIG. 5A, each one copper interconnect 26 located in a respective trench 18 in the memory cell area 52 contacts a single narrow tungsten plug 14. In contrast, plural copper interconnects 226 located in trenches 218 in the peripheral area 54 may contact a single wide tungsten plug 214. In this case, one or more electrical connectors 226a are provided to electrically connect each set of plural copper interconnects 226 which contact a single wide tungsten plug 214. As shown in FIG. 5B, the connectors 226a may comprise copper strips which are deposited in trenches 219 which extend in different (e.g., perpendicular) direction to trenches 218 through the rails 16. In other words, the connectors 226a and the interconnects 226 may be formed during the same copper layer deposition step into overlapping trenches 218, 219 extending in different directions.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a semiconductor device, comprising:
   providing a substrate comprising a plurality of sacrificial rails separated by trenches;
   sputtering a non-conformal copper layer at a temperature above 150° C. in the trenches and over the sacrificial rails;
   heating the semiconductor device to a temperature above 300° C. to reflow the copper layer from the top of the sacrificial rails into the trenches to form copper rails in the trenches;
   removing at least a portion of the sacrificial rails after reflowing the copper layer; and
   depositing a non-conformal insulating layer over the copper rails such that air gaps are formed between adjacent copper rails, wherein the non-conformal insulating forms a continuous layer over the air gap;
   further comprising depositing a conformal liner on the sacrificial rails prior to sputtering the non-conformal copper layer, such that the liner is located on top of the sacrificial rails and covers sidewalls of the trenches;
   further comprising depositing a cap layer on a top surface of the copper rails in the trenches, such that the copper rails are sealed by the cap layer on their top surface, the liner on their sidewalls, and at least one of a conductive plug and an interlayer insulating layer on their bottom surface;
   further comprising: planarizing the cap layer to remove the cap layer and the liner from a top surface of the sacrificial rails to expose a top surface of the sacrificial rails while leaving a cap on each copper rail in the trenches; and
   selectively etching the sacrificial rails to remove at least an upper portion of the sacrificial rails without significantly etching the cap, the liner or the copper rails.

2. The method of claim 1, wherein:
   sputtering the non-conformal copper layer is conducted at a temperature of 175° C. to 250° C.;
   reflow of the non-conformal copper layer is conducted at a temperature of 350° C. to 400° C. to form a meniscus in the top surface of the copper rails;
   the liner comprises tantalum nitride and the cap comprises tantalum nitride or silicon nitride;
   the sacrificial rails comprise a silicon nitride etch stop lower portion and a silicon oxide upper portion;
   selectively etching the sacrificial rails to remove at least an upper portion of the sacrificial rails comprises removing the silicon oxide upper portion and stopping on the silicon nitride etch stop lower portion; and
   depositing the non-conformal insulating layer comprises depositing a non-conformal silicon oxide layer by PECVD using a silane and at least one of nitrous oxide and ozone sources, such that the silicon oxide layer is located in contact with the cap and an upper portion of the liner on the copper rails.

3. A method of making a semiconductor device., comprising:
   providing a substrate comprising a plurality of sacrificial rails separated by trenches;
   sputtering a non-conformal copper layer at a temperature above 150° C. in the trenches and over the sacrificial rails;
   heating the semiconductor device to a temperature above 300° C. to reflow the copper layer from the top of the sacrificial rails into the trenches to form copper rails in the trenches;
   removing at least a portion of the sacrificial rails after reflowing the copper layer: and
   depositing a non-conformal insulating layer over the copper rails such that air gaps are formed between adjacent copper rails;
   wherein:
      the semiconductor device comprises a NAND nonvolatile memory having a NAND memory cell region and a peripheral region; and
      the copper rails comprise first copper interconnects for NAND bit lines in the NAND memory cell region;
   further comprising second copper interconnects for the NAND peripheral region, wherein the second copper interconnects are deposited into wider and shallower peripheral trenches than the trenches containing the first copper interconnects, such that the second copper interconnects are wider and thinner than the first copper interconnects; and
   further comprising:

depositing a cap layer over the first and the second interconnects; and planarizing the cap layer such that a cap remains in a meniscus on a top surface of the first copper interconnects in the trenches between the sacrificial rails, and such that the cap layer is removed completely over the second copper interconnects which are located in the shallower peripheral trenches.

* * * * *